United States Patent
Matz et al.

(10) Patent No.: US 7,566,627 B2
(45) Date of Patent: Jul. 28, 2009

(54) AIR GAP IN INTEGRATED CIRCUIT INDUCTOR FABRICATION

(75) Inventors: Phillip D Matz, Macungie, PA (US); Stephan Grunow, Dallas, TX (US); Satyavolu Srinivas Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 11/771,298

(22) Filed: Jun. 29, 2007

(65) Prior Publication Data

US 2009/0001510 A1 Jan. 1, 2009

(51) Int. Cl.
*H01L 21/20* (2006.01)

(52) U.S. Cl. .................. 438/381; 257/E21.022

(58) Field of Classification Search ........... 438/381, 438/421, 422, 400; 257/E21.022
See application file for complete search history.

(56) References Cited

U.S. PATENT DOCUMENTS

| | | | |
|---|---|---|---|
| 6,395,637 B1 * | 5/2002 | Park et al. ................. | 438/706 |
| 6,908,825 B2 | 6/2005 | Xu et al. | |
| 6,995,470 B2 * | 2/2006 | Ahn et al. ................. | 257/758 |
| 7,094,669 B2 | 8/2006 | Bu et al. | |
| 7,179,747 B2 * | 2/2007 | Rao et al. ................. | 438/700 |
| 2008/0173976 A1 * | 7/2008 | Stamper et al. .......... | 257/531 |
| 2009/0057824 A1 * | 3/2009 | Kwak ........................ | 257/531 |

FOREIGN PATENT DOCUMENTS

KR 1020020035489 5/2002

* cited by examiner

*Primary Examiner*—Bradley K Smith
(74) *Attorney, Agent, or Firm*—Wade J. Brady, III; Frederick J. Telecky, Jr.

(57) ABSTRACT

In accordance with the invention, there are inductors with an air gap, semiconductor devices, integrated circuits, and methods of fabricating them. The method of making an inductor with an air gap can include fabricating a first level of inductor in an intra-metal dielectric layer including one or more inductor loops, one or more vias, and one or more copper bulkhead structures, forming an inter-level dielectric layer over the first level and repeating the steps to form two or more levels of inductor. The method can also include forming an extraction via, forming an air gap between the inductor loops by removing portions of the intra-metal dielectric layer coupled to the extraction via using super critical fluid process, and forming a non-conformal layer to seal the extraction via.

16 Claims, 7 Drawing Sheets

AIR GAP IN INTEGRATED CIRCUIT INDUCTOR FABRICATION

FIELD OF THE INVENTION

The subject matter of this invention relates to methods of fabricating semiconductor devices. More particularly, the subject matter of this invention relates to methods of making inductors with reduced parasitic capacitance.

BACKGROUND OF THE INVENTION

Figure 1:
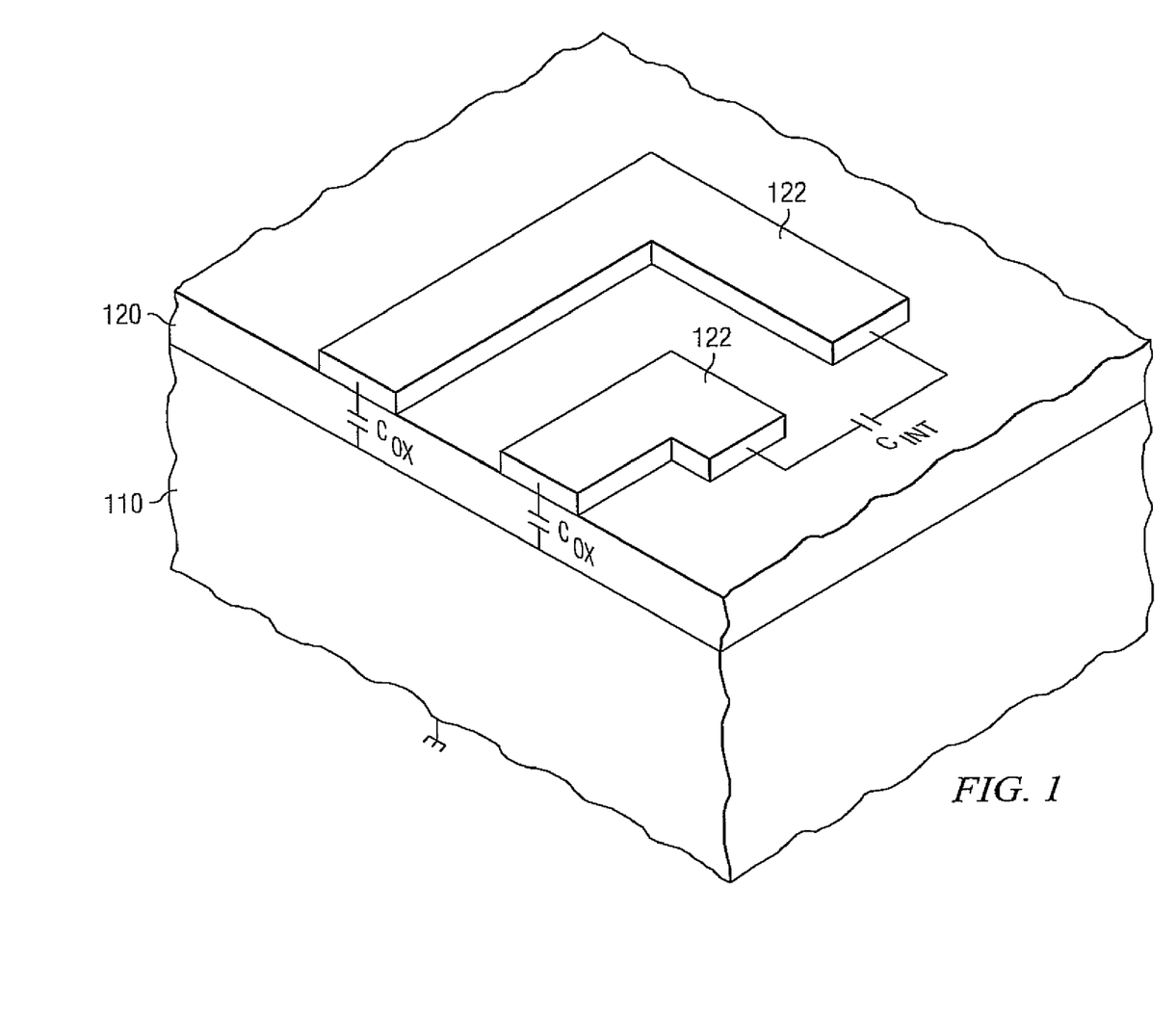
FIG. 1 is a schematic illustration of an exemplary inductor having parasitic capacitances in a system on chip.

System-on-chip solutions need an increasing amount of on-chip high inductance and high quality factor inductors. Inductors are designed to minimize series resistance, and maximize inductance, with low parasitic components. FIG. 1 is a schematic illustration of an exemplary inductor having parasitic capacitances $C_{ox}$ and $C_{int}$ in a system on chip, wherein $C_{ox}$, is the capacitance between the substrate 110 and the inductor loops 122 and $C_{int}$ is the capacitance between the inductor loops 122. The parasitic capacitances, $C_{int}$, $C_{ox}$ as shown in FIG. 1, driven by the dielectric present around the inductor coils degrade the inductor performance.

A conventional solution to improving inductor performance is a poor-gap-fill solution. This approach uses ALCAP (aluminum capping) level inductors with appropriately chosen spacing and dielectric gap fill properties. Even though the utilization of ALCAP level for inductors is unique, this approach has a major drawback as aluminum is not the preferred material for inductor coils. Another conventional solution utilizes wet etching dielectric in the inductor area followed by a poor-gap-fill dielectric deposition. However, this method is costlier and the wet etching of the dielectric poses a potential negative impact to the integrity of Cu metallization.

Thus, there is a need to overcome these and other problems of the prior art and to provide methods of reducing parasitic capacitance in the inductors.

SUMMARY OF THE INVENTION

In accordance with the invention, there is a method of making an integrated circuit. The method can include (a) forming a first level of a semiconductor structure, wherein forming the first level includes depositing an intra-metal dielectric layer over a substrate and forming one or more damascene structures in the intra-metal dielectric layer, wherein the each of the one or more damascene structures includes one or more copper interconnects, one or more vias, one or more inductor loops, and one or more copper bulk head structures and (b) forming an inter-level dielectric layer over the first level, wherein the one or more vias extend through the inter-level dielectric layer. The method can also include repeating steps (a) and (b) as desired to form one or more levels of semiconductor structure and forming an extraction via through the one or more intra-metal dielectric layers and one or more inter-level dielectric layers. The method can further include forming an air gap between the inductor loops by removing portions of the intra-metal dielectric layer coupled to the extraction via using a supercritical fluid process and forming a non-conformal layer disposed on an etch stop layer to hermetically seal an opening of the extraction via, wherein the copper bulk head structure seals the supercritical fluid from adjacent portions of the semiconductor structure.

According to various embodiments, there is a semiconductor device including one or more levels of semiconductor structure, wherein each of the one or more levels includes one or more damascene structures in an intra-metal dielectric layer, wherein the intra-metal dielectric layer includes one or more inductor loops, and one or more vias in an air gap, wherein the air gap is formed by removing portions of the intra-metal dielectric layer between the inductor loops and coupled to an extraction via using a supercritical fluid process, one or more copper interconnects, and one or more copper bulk head structures, wherein the copper bulk head structure provides a seal to prevent supercritical fluid flow to adjacent portions of the semiconductor structure. The semiconductor device can also include an inter-level dielectric layer between the one or more levels, wherein the one or more vias extend through the inter-level dielectric layer and a non-conformal layer over an etch stop layer, wherein the non-conformal layer hermetically seals an opening of the extraction via.

According to various embodiments of the present teachings there is a method of making an inductor with an air gap including forming one or more levels of inductor, wherein each of the one or more levels includes one or more inductor loops, one or more vias, and one or more copper bulkhead structures in an intra-metal dielectric layer, wherein the intra-metal dielectric layer includes a material having a solubility in a supercritical fluid. The method can also include forming an inter-level dielectric layer between each level of inductor, wherein the inter-level dielectric layer includes material resistant to removal by the supercritical fluid and forming an extraction via through the intra-metal dielectric layer and the inter-level dielectric layer. The method can further include forming an air gap between the inductor loops by removing portions of the intra-metal dielectric layer coupled to the extraction via using the supercritical fluid and forming a non-conformal layer disposed on an etch stop layer to hermetically seal an opening of the extraction via, wherein the copper bulk head structure seals the flow of the supercritical fluid to adjacent portions of the semiconductor structure.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the exemplary embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The term "interconnect" is used interchangeably herein with terms including interconnect line, metal lines, trace, wire, conductor, signal path, and signaling medium. Interconnects are generally made of aluminum, copper, or alloys of copper with aluminum, manganese, silver, etc. Interconnects are conductors that provide signal paths for coupling or interconnecting electrical circuitry. Conductors other than the above mentioned metals include, for example, doped polysilicon, doped single crystal silicon, titanium, molybdenum, tungsten, and refractory metal silicides.

Figure 2A:
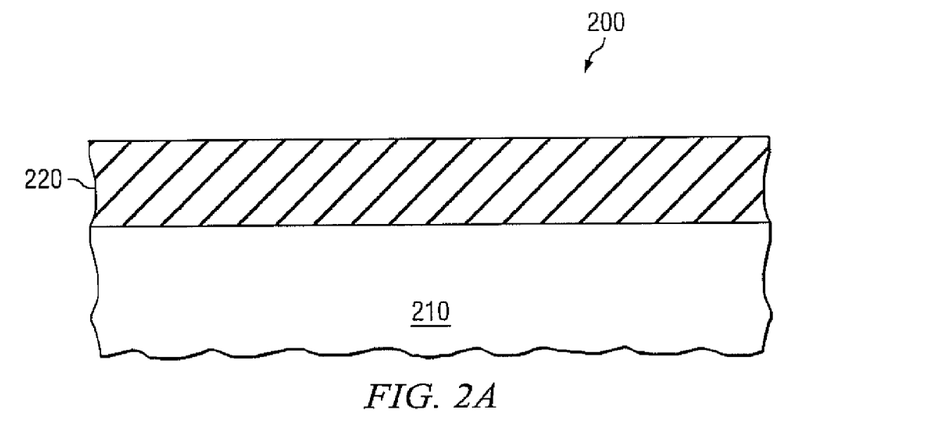
FIGS. 2A-2H depict schematic illustrations of an exemplary method for making an integrated circuit, according to various embodiments of the present teachings.
Figure 2B:
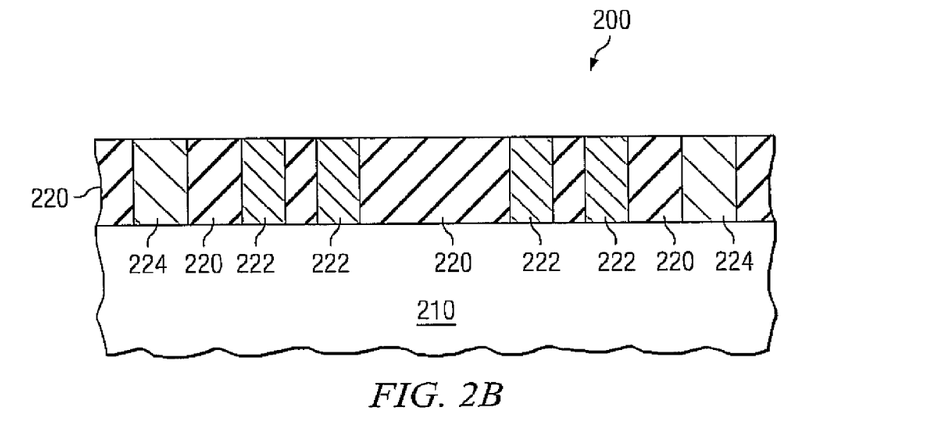

FIGS. 2A-2H are schematic illustrations of an exemplary method of making an integrated circuit 200, according to the present teachings. The method of making an integrated circuit 200 can include forming a first level 201 of a semiconductor structure. The step of forming the first level 201 of the semiconductor structure can include depositing an intra-metal dielectric layer 220 over a substrate 210 as shown in FIG. 2A and forming one or more damascene structures in the intra-metal dielectric layer 220 including one or more copper interconnects (not shown), one or more vias (not shown), one or more inductor loops 222, and one or more copper bulkhead structures 224, as shown in FIG. 2B. In various embodiments, the substrate 210 can be any semiconductor wafer. In some embodiments, the substrate 210 can be a semiconductor wafer with transistors and contacts through overlying dielectric to the transistors. In other embodiments, the substrate 210 can be a semiconductor wafer that has been fabricated to the point where it has transistors and any number of interconnect levels over the transistor, prior to the formation of an interconnect level that includes the inductor with an air gap as disclosed herein.

In various embodiments, the intra-metal dielectric layer 220 can be formed of a material having a solubility in a supercritical fluid. Supercritical fluid is a substance above its critical temperature and critical pressure. Supercritical fluids can be regarded as "hybrid solvents" with properties between those of gases and liquids, i.e. a solvent with a low viscosity, high diffusion rates, and no surface tension. Furthermore, the density of supercritical fluid can be changed dramatically with a slight change in the temperature or the pressure. Exemplary supercritical fluids include, but are not limited to, carbon dioxide, water, methanol, ammonia, and acetone. In some embodiments, the intra-metal dielectric layer 220 can be formed of one or more of silicon oxide, tetraethyl orthosilicate (TEOS), and carbon doped oxide material (CDO) which is also called organo-silicate glass (OSG), methylsilsesquioxane (MSQ), hydrogen silsesquioxane (HSQ), fluorinated silicate glass (FSG), and phosphorous doped silicate glass (PSG). In various embodiments, the intra-metal dielectric layer 220 can include any silicon oxide material that is soluble in supercritical fluid and has desirable physical characteristics, such as, for example, inexpensive, easy to manufacture, hard, and resistant to moisture absorption. The intra-metal dielectric layer 220 can be formed by any suitable method such as, for example, chemical vapor deposition (CVD), low pressure chemical vapor deposition (LPCVD), plasma enhanced chemical vapor deposition (PECVD), and atomic layer deposition (ALD).

Inductor loops 222 can be formed of copper or an alloy of copper with metals selected from the group consisting of aluminum, manganese, titanium, and silver. In some embodiments, the inductor loops 222 formed of copper or an alloy of copper can be encapsulated with one or more thin layers of metal and dielectric that can serve as a copper diffusion barrier. In other embodiments, the one or more thin layers of metal and dielectric that can serve as the copper diffusion barrier can be selected from the group consisting of tantalum, tantalum nitride, and silicon nitride. The copper interconnects (not shown), the one or more vias (not shown), the inductor loops 222, and the copper bulkhead structures 224 can be formed using any suitable method including, but not limited to photolithography and etching. The layout of the copper bulkhead structures 224 can follow the similar "design rules" as the rest of the integrated circuit 200 in terms of the allowable width of copper trench, and the distance of the copper trench of the copper bulkhead 224 from another copper trench. The design rules can also apply to the vias that can be present between two copper trenches (one above the other) as well as vias in the copper bulkhead 224. In some embodiments, vias are not included in the copper bulkhead 224. In other embodiments, vias included in the copper bulkhead 224 can be narrow trench like structures, similar to the via that is currently used as a 'scribe-seal' (not shown) all the way around a chip.

Figure 2C:
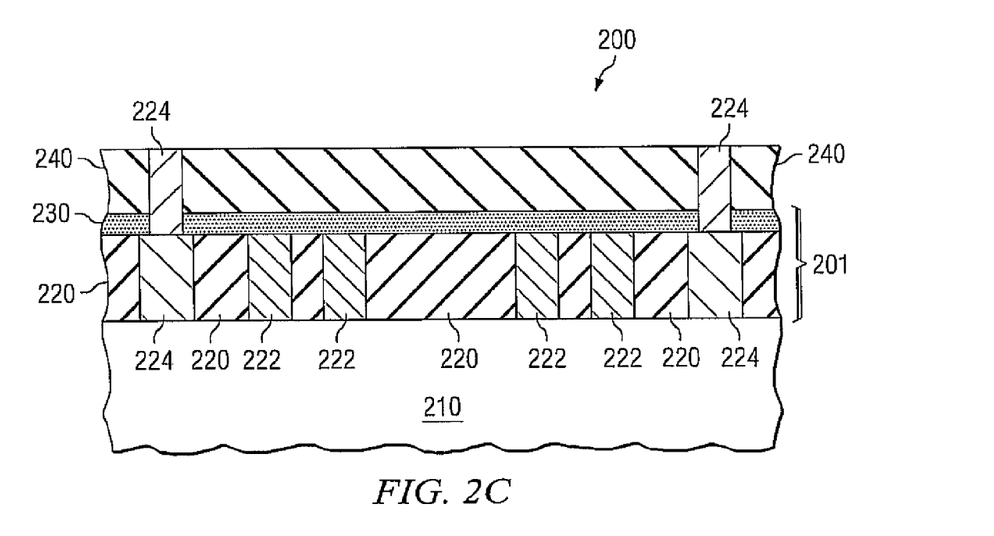

The method of making an integrated circuit 200 can also include forming an inter-level dielectric layer 240 over the first level 201 of the semiconductor structure as shown in FIG. 2C, wherein the one or more vias extend through the inter-level dielectric layer. The inter-level dielectric layer can be formed by any suitable method. In various embodiments, the inter-level dielectric layer 240 can be formed of a material having resistance to removal by the supercritical fluid process. In some embodiments, the inter-level dielectric layer 240 can include one or more of fluorinated silicate glass, silicon nitride, silicon oxide, and carbon doped oxide material (CDO) which is also called organo-silicate glass (OSG). The inter-level dielectric layer 240 can be formed by any suitable method such as, for example, chemical vapor deposition, low pressure chemical vapor deposition, plasma enhanced chemical vapor deposition, glow discharge, thermo catalytic (or hot wire) CVD, and atomic layer deposition (ALD). In some embodiments, the method of making an integrated circuit 200 can also include forming an etch stop layer 230 over the intra-metal dielectric layer 220 of the first level 201 of the semiconductor structure and under the inter-level dielectric layer 240, as shown in FIG. 2C. In certain embodiments, the etch stop layer 230 can be formed of one or more of an oxygen doped silicon carbide layer, a nitrogen doped silicon carbide layer, and a silicon nitride layer. The etch stop layer 230 can be deposited by any suitable method including, but not limiting to, chemical vapor deposition, physical vapor deposition, low pressure chemical vapor deposition, atmospheric pressure chemical vapor deposition, plasma enhanced chemical vapor deposition, and atomic layer deposition.

Figure 2D:
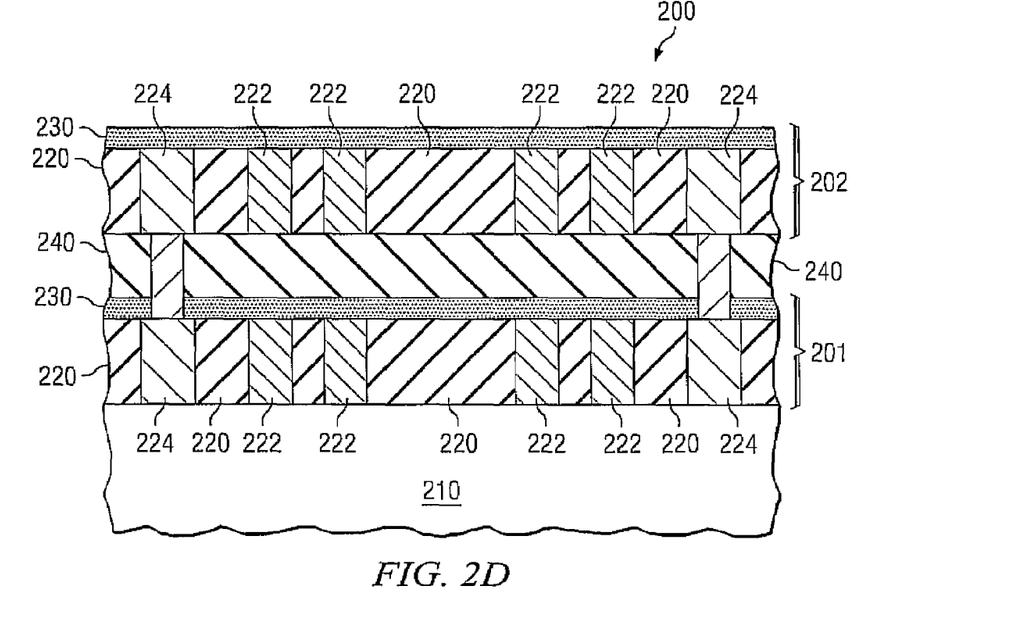
Figure 2E:
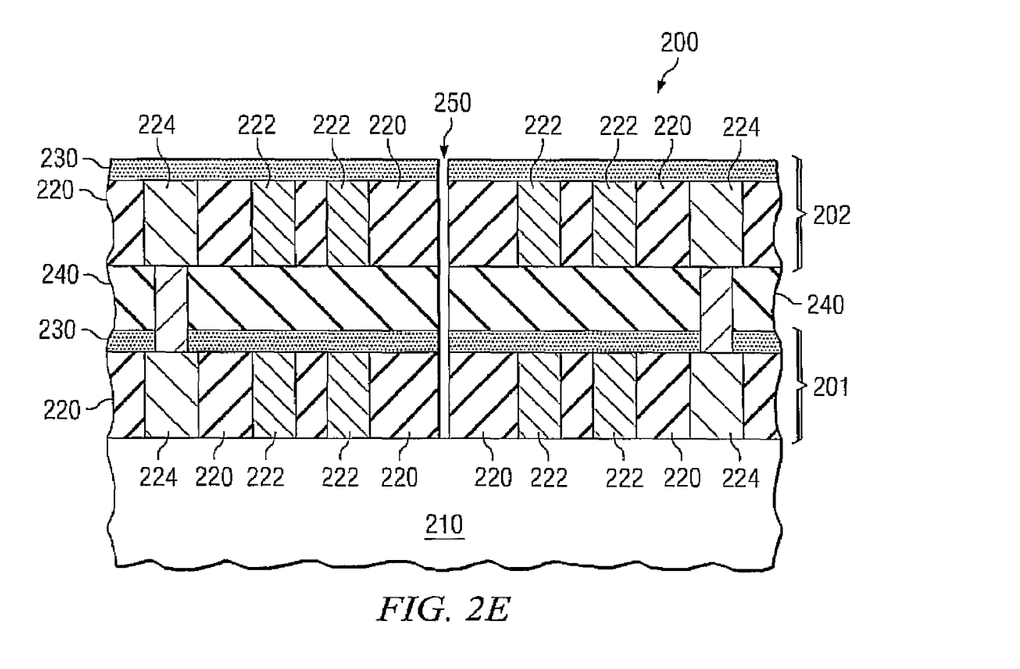

The method of making an integrated circuit 200 can further include repeating the steps of forming one or more damascene structures in the intra-metal dielectric layer 220 and forming an inter-level dielectric layer 240 to form one or more levels of semiconductor structure. In various embodiments, the one or more vias (not shown) can be present between the inductor loops 222 and within the copper bulkhead 224, so that the inductor loops 222 can climb and can be connected from one level to another of the semiconductor structure. FIG. 2D shows exemplary integrated circuit 200 with two levels of semiconductor structures 201 and 202. The method can also include forming an extraction via 250 through the one or more intra-metal dielectric layers 220 and one or more inter-level dielectric layers 240, as shown in FIG. 2E. The extraction via 250 can be formed by any suitable method including, but not limited to, chemical etching, plasma etching, physical (ion milling) etching, and reactive ion etching. In some embodiments, the extraction via 250 can be formed by a fluorocarbon-based plasma etching process. In various embodiments, the step of forming an extraction via 250 can also include post etch cleaning of the semiconductor structure 201, 202.

Figure 2F:
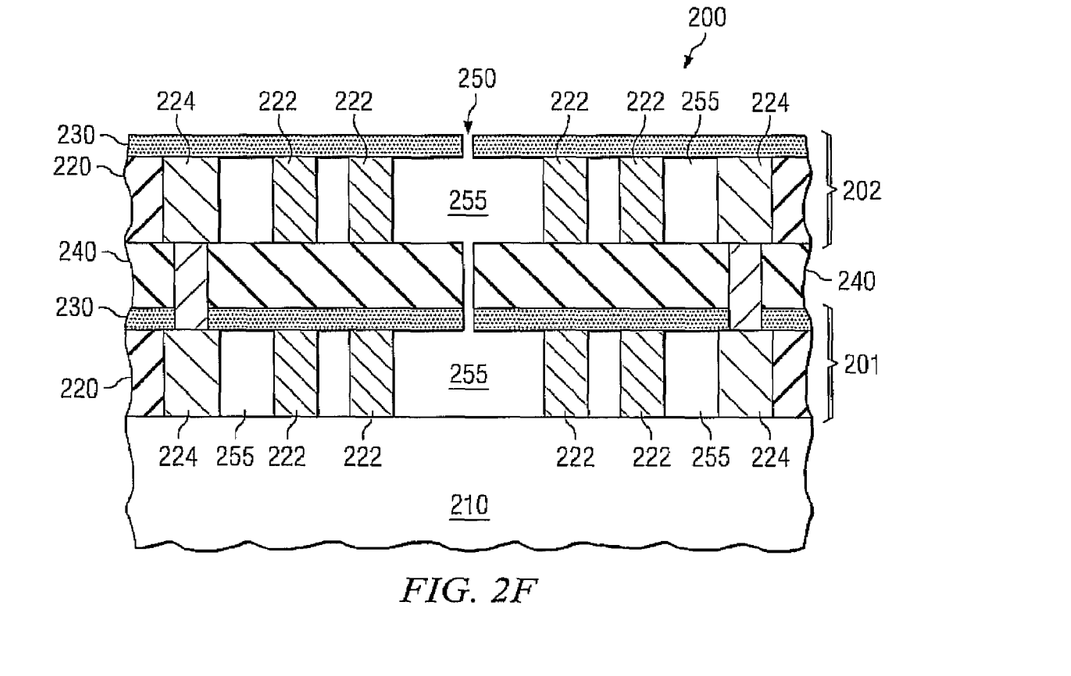

The method of making an integrated circuit 200 can also include forming an air gap 255 between the inductor loops 222 by removing portions of the intra-metal dielectric layer 220 coupled to the extraction via 250 using a supercritical fluid (SCF) process, as shown in FIG. 2F. In some embodiments, the copper bulk head structure 224 seals the supercritical fluid from adjacent portions of the semiconductor structure 201, 202, thereby limiting denuding of the region of interest, such as, for example, the intra-metal dielectric layer 220 around the inductor loops 222. In various embodiments, the integrated circuit 200 including the extraction via 250 can be placed in a supercritical fluid chamber (not shown) for the denuding of the selected region or regions of intra-metal dielectric layer 240 around the inductor loops 222. The denuding process can be performed in a high pressure supercritical fluid chamber manufactured by TEL (Tokyo Electric Company). In some embodiments, the supercritical fluid (SCF) process can be a single component SCF process. In other embodiments, the supercritical fluid (SCF) process can be a multi-component SCF process. The multi-component SCF process can include a solvent and one or more co-solvents. In various embodiments, the solvent can be carbon dioxide present in an amount from about 60 to about 95 volume %, and co-solvents can be such as, for example, alcohol present in an amount from about 0 to about 30 volume %, water present in an amount from about 0 to about 10 volume %, and etchant (i.e. fluoride-based acid) present in an amount from about 0 to about 2 volume %. The concentration of the co-solvent(s) in the multi-component SCF process can be adjusted to effectively denude polar, non-polar, and/or ionic dielectric material of the intra-metal dielectric layer 220. In some embodiments, the process parameters of the supercritical fluid (SCF) process can be those that are typically used to maintain the $CO_2$, plus the co-solvents (i.e. alcohols such as methanol) and the active etchant (i.e. HF), in a supercritical fluid state. The system operating pressure can be above about 1050 psi and the temperature can be above about 31° C. It should be noted that the supercritical carbon dioxide ($scCO_2$) can be formed at temperatures above about 31° C. and pressures above 1050 psi. One of ordinary skill in the art would know that the system temperature and pressure can be adjusted as needed to maintain the characteristics of a supercritical fluid. Other considerations when adjusting temperature and pressure include SCF diffusivity and polarity. Furthermore, the level of penetration and extraction of the dielectric material that can be achieved by any SCF process can be time-dependent.

In various embodiments, the supercritical fluid (SCF) process can be other than $scCO_2$. In some embodiments, methanol based SCF can be used at a temperature above the critical temperature of 239.4° C. and at a pressure above the critical pressure of 1174.2 psi. In some other embodiments, ammonia based SCF can be used at a temperature above the critical temperature of 132.4° C. and at a pressure above the critical pressure of 1624.7 psi.

Figure 2G:
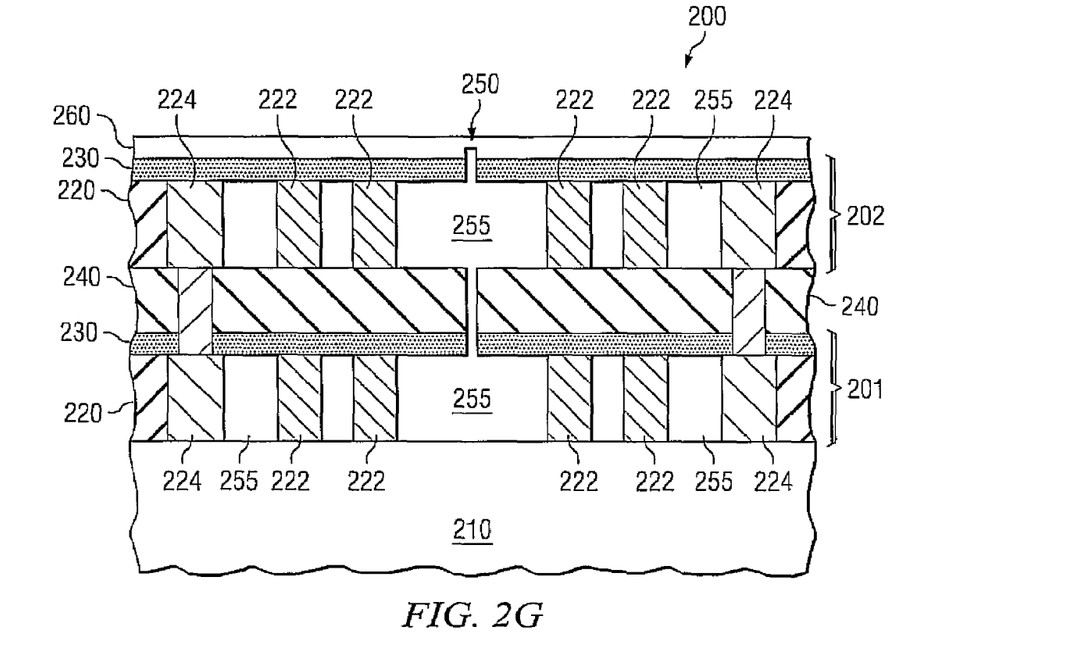
Figure 2H:
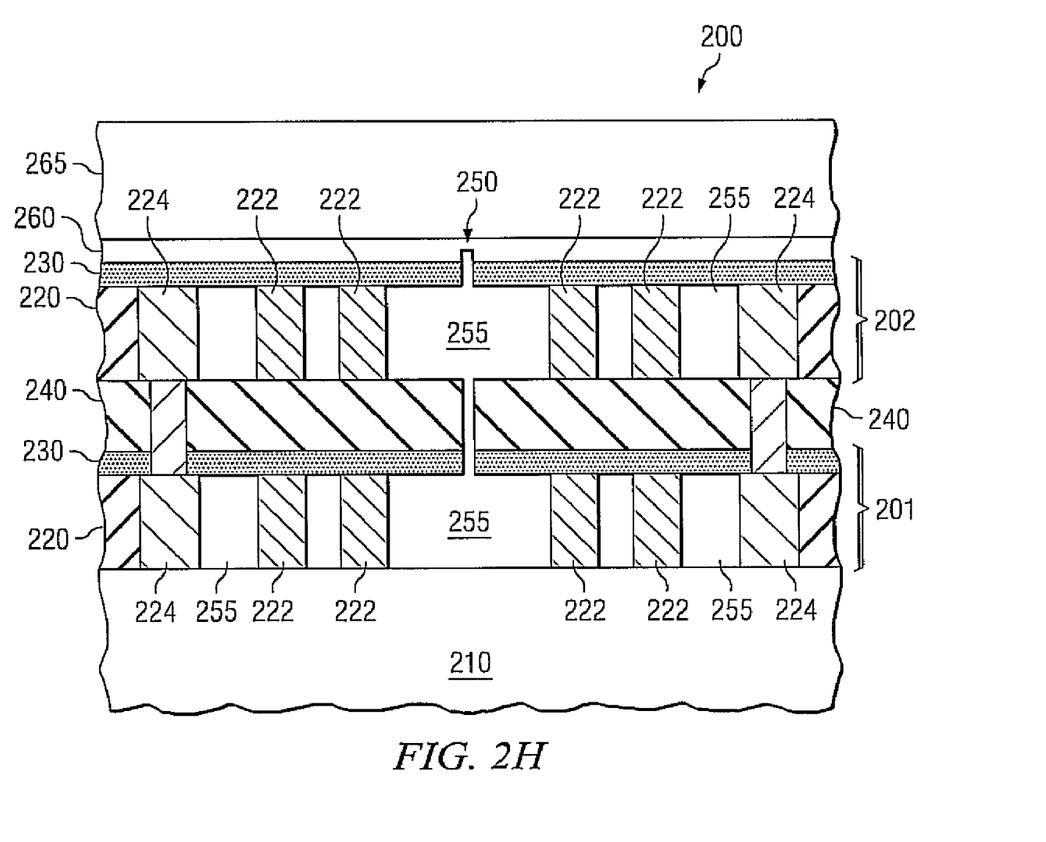

Referring back to the method of making an integrated circuit 200, the method can further include forming a non-conformal layer 260 disposed on the etch stop layer 230 to hermetically seal an opening of the extraction via 250 and the air gap 255, as shown in FIG. 2G. The non-conformal layer 260 can be formed of silicon oxide, silicon nitride, silicon oxy-nitride, carbon-doped silicon oxide, and combinations thereof. Any suitable manufacturing process, such as, for example, physical vapor deposition or chemical vapor deposition can be used to form the non-conformal layer 260. In some embodiments, the air gap 255 can be back filled with an inert gas such as argon or nitrogen before forming the non-conformal layer 260. In other embodiments, the non-conformal layer 260 can also act as the protective overcoat for the integrated circuit 200. In some other embodiments, a protective overcoat 265 can be formed over the non-conformal layer 260, as shown in FIG. 2H. The protective overcoat 265 can include one or more layers. Typical layers include, but are not limited to, silicon oxide, silicon nitride, silicon oxy-nitride, carbon-doped silicon oxide, phosphosilicate glass, organic polymers such as polyimide, other materials, either alone or in combination.

Figure 3:
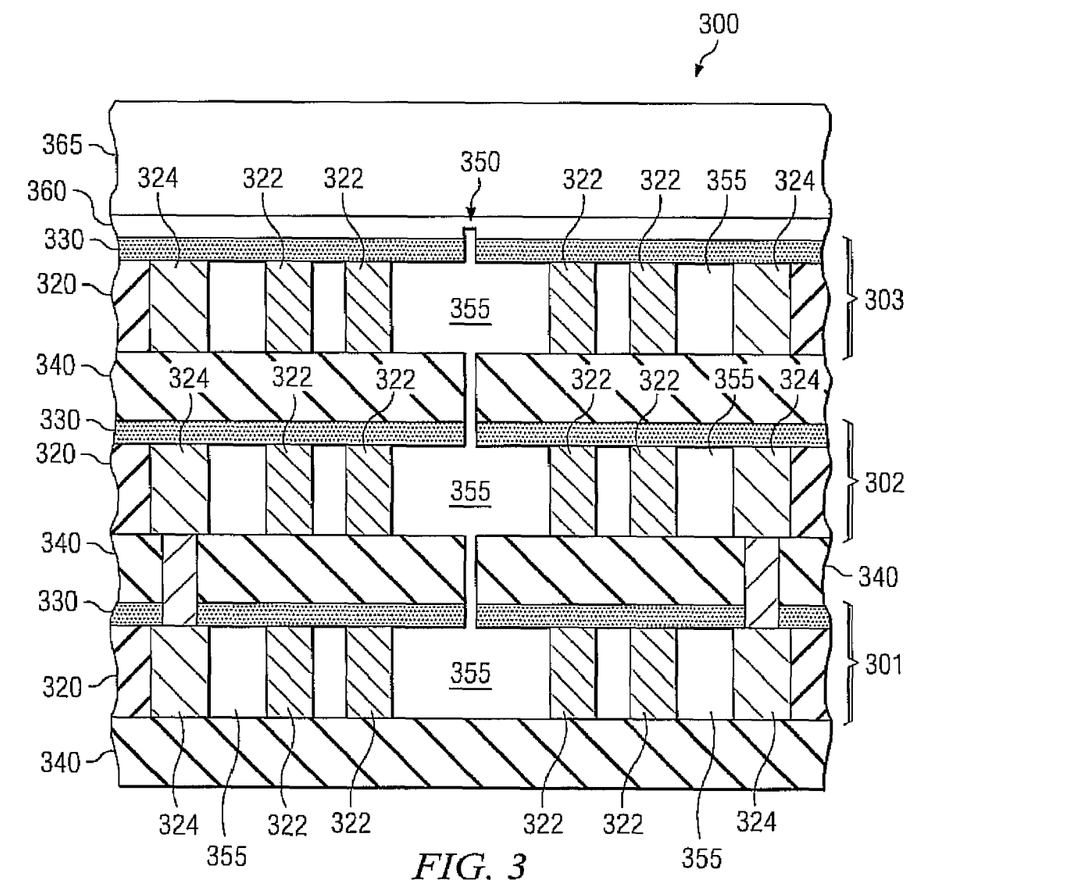
FIG. 3 is a schematic illustration of an exemplary semiconductor device, according to various embodiments of the present teachings.

FIG. 3 is a schematic illustration of an exemplary semiconductor device 300. The exemplary semiconductor device 300 shown in FIG. 3 can include one or more levels of semiconductor structure, such as, for example three levels 301, 302, 303. Each level of the semiconductor structure 301, 302, 303 can include one or more damascene structures in an intra-metal dielectric layer 320, wherein the intra-metal dielectric layer 320 can include one or more copper interconnects (not shown), one or more copper bulk head structures 324, and one or more inductor loops 322 and one or more vias (not shown) in an air gap 355, wherein the air gap 355 can be formed by removing portions of the intra-metal dielectric layer 320 between the inductor loops 322 and coupled to an extraction via 350 using a supercritical fluid process. The copper bulkhead structure 324 can provide a seal to prevent supercritical fluid flow to adjacent portions of the semiconductor structure. The copper bulkhead structure 324 can also provide structural support to each level 301, 302, 303 of the semiconductor structure. The semiconductor device 300 can also include an inter-level dielectric layer 340 between the one or more levels 301, 302, 303 of the semiconductor structure, wherein the one or more vias (not shown) extend through the inter-level dielectric layer 340. In various embodiments, the one or more vias (not shown) can be present between the inductor loops 322 and within the copper bulkhead 324, so that the inductor loops 322 can climb and can be connected from one level to another of the semiconductor structure. The semiconductor device can further include a non-conformal layer 360 over an etch stop layer 330, wherein the non-conformal layer 360 hermetically seals an opening of the extraction via 350. In some embodiments, the semiconductor device 300 can also include an etch stop layer 330 over the intra-metal dielectric layer 320. In other embodiments, the semiconductor device can also include a protective overcoat layer 365 over the non-conformal layer 360.

Figure 4:
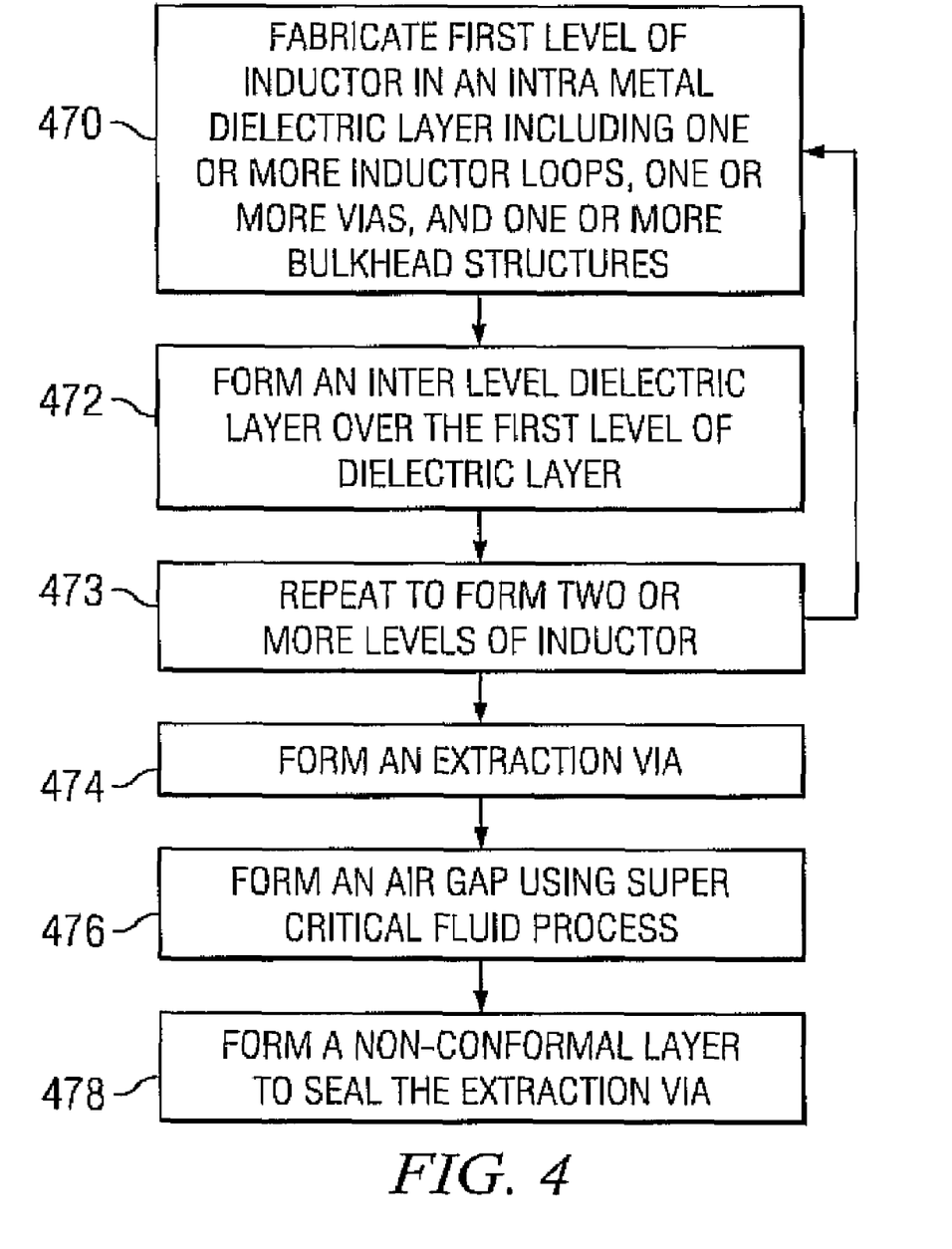
FIG. 4 depicts a flow chart of an exemplary method of making an inductor with an air gap, according to various embodiments of the present teachings.

According to various embodiments, there is a method of making an inductor with an air gap as shown in the FIG. 4. The method can include forming one or more levels of inductor. The method can further include forming a first level of inductor as in 470, wherein the first level of inductor includes one or more inductor loops, one or more vias, and one or more copper bulk head structures in an intra-metal dielectric layer. In various embodiments, the intra-metal dielectric layer can include a material having a solubility in the supercritical fluid. The method can also include forming an inter-level dielectric layer over the first level of inductor as in 472, wherein the one or more vias extend through the inter-level dielectric layer and repeating the steps to form two or more levels of inductor as in 473. In some embodiments, the inter-level dielectric layer can include material resistant to removal by the supercritical fluid process. The method of making an inductor with an air gap can also include forming an extraction via through the intra-metal dielectric layer and the inter-level dielectric layer as in 474 and forming an air gap between the inductor loops by removing portions of the intra-metal dielectric layer coupled to the extraction via using a supercritical fluid process as in 476. The method can further include forming a non-conformal layer disposed on an etch stop layer to hermetically seal an opening of the extraction via as in 478. In some embodiments, the copper bulk head structure can seal the flow of supercritical fluid to adjacent portions of the semiconductor structure and can provide structural support.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of making an integrated circuit comprising:
   (a) forming a first level of a semiconductor structure, wherein forming the first level comprises:
      depositing an intra-metal dielectric layer over a substrate;
      forming one or more damascene structures in the intra-metal dielectric layer, wherein the each of the one or more damascene structures comprises one or more copper interconnects, one or more vias, one or more inductor loops, and one or more copper bulk head structures;
   (b) forming an inter-level dielectric layer over the first level, wherein the one or more vias extend through the inter-level dielectric layer;
   (c) repeating steps (a) and (b) as desired to form one or more levels of semiconductor structure;
   (d) forming an extraction via through the one or more intra-metal dielectric layers and one or more inter-level dielectric layers;
   (e) forming an air gap between the inductor loops by removing portions of the intra-metal dielectric layer coupled to the extraction via using a supercritical fluid process; and
   (f) forming a non-conformal layer disposed on an etch stop layer to hermetically seal an opening of the extraction via,
   wherein the copper bulk head structure seals the supercritical fluid from adjacent portions of the semiconductor structure.

2. The method of claim 1, wherein the extraction via extends from one level to another through the inter-level dielectric layer.

3. The method of claim 1, wherein the step of forming an extraction via comprises one or more of chemical etching, plasma etching, physical etching, and reactive ion etching.

4. The method of claim 1 further comprising back-filling the air gap with an inert gas before the step of forming the non-conformal layer, wherein the inert gas is selected from the group consisting of argon and nitrogen.

5. The method of claim 1 further comprising forming a protective overcoat layer over the non conformal layer.

6. The method of claim 1, wherein forming the intra-metal dielectric layer comprises forming a dielectric layer with a material having a solubility in the supercritical fluid.

7. The method of claim 1, wherein the intra-metal dielectric layer comprises one or more of silicon oxide, tetraethyl orthosilicate, and carbon doped oxide material, methylsilsesquioxane, hydrogen silsesquioxane, fluorinated silicate glass, and phosphorous doped silicate glass.

8. The method of claim 1, wherein forming the inter-level dielectric layer comprises forming a dielectric layer with a material resistant to removal by the supercritical fluid process.

9. The method of claim 1, wherein the inter-level dielectric layer comprises one or more of fluorinated silicate glass, silicon nitride, silicon oxide, and carbon doped oxide material.

10. The method of claim 1, wherein the supercritical fluid process comprises using super critical carbon dioxide.

11. A method of making an inductor with an air gap comprising:
   forming one or more levels of inductor, wherein each of the one or more levels comprises one or more inductor loops, one or more vias, and one or more copper bulkhead structures in an intra-metal dielectric layer, wherein the intra-metal dielectric layer comprises a material having a solubility in a supercritical fluid;
   forming an inter-level dielectric layer between each level of inductor, wherein the inter-level dielectric layer comprises material resistant to removal by the supercritical fluid;
   forming an extraction via through the intra-metal dielectric layer and the inter-level dielectric layer;
   forming an air gap between the inductor loops by removing portions of the intra-metal dielectric layer coupled to the extraction via using the supercritical fluid; and forming a non-conformal layer disposed on an etch stop layer to hermetically seal an opening of the extraction via, wherein the copper bulk head structure seals the flow of the supercritical fluid to adjacent portions of the semiconductor structure.

12. The method of claim 11, further comprising extending the one or more vias through the inter-level dielectric layer.

13. The method of claim 11, wherein the step of forming an extraction via comprises one or more of chemical etching, plasma etching, physical etching, and reactive ion etching.

14. The method of claim 11, wherein the intra-metal dielectric layer comprises one or more of silicon oxide, tetraethyl orthosilicate, and carbon doped oxide material, methylsilsesquioxane, hydrogen silsesquioxane, fluorinated silicate glass, and phosphorous doped silicate glass.

15. The method of claim 11, wherein the inter-level dielectric layer comprises one or more of fluorinated silicate glass, silicon nitride, silicon oxide, and carbon doped oxide material.

16. The method of claim 11, wherein the supercritical fluid comprises super critical carbon dioxide.

* * * * *